(12) United States Patent
Kojima et al.

(10) Patent No.: US 9,109,294 B2
(45) Date of Patent: Aug. 18, 2015

(54) MANUFACTURING METHOD FOR CONTACT FOR CURRENT INSPECTION JIG, CONTACT FOR CURRENT INSPECTION JIG MANUFACTURED USING SAID METHOD, AND CURRENT INSPECTION JIG PROVIDED WITH SAID CONTACT

(75) Inventors: Kesao Kojima, Kyoto (JP); Yutaka Ichikawa, Kyoto (JP)

(73) Assignee: NIDEC-READ CORPORATION, Kyoto-Shi, Kyoto (JP)

( * ) Notice: Subject to any disclaimer, the term of this patent is extended or adjusted under 35 U.S.C. 154(b) by 442 days.

(21) Appl. No.: 13/578,436

(22) PCT Filed: Jan. 27, 2011

(86) PCT No.: PCT/JP2011/051560
§ 371 (c)(1),
(2), (4) Date: Nov. 13, 2012

(87) PCT Pub. No.: WO2011/099371
PCT Pub. Date: Aug. 18, 2011

(65) Prior Publication Data
US 2013/0057309 A1  Mar. 7, 2013

(30) Foreign Application Priority Data
Feb. 12, 2010  (JP) .................................. 2010 029354

(51) Int. Cl.
| H01R 43/00 | (2006.01) |
| C25D 1/02 | (2006.01) |
| C25D 5/12 | (2006.01) |
| G01R 3/00 | (2006.01) |
| C25D 3/48 | (2006.01) |

(52) U.S. Cl.
CPC .. C25D 1/02 (2013.01); C25D 5/12 (2013.01); G01R 3/00 (2013.01); C25D 3/48 (2013.01); *Y10T 29/49213* (2015.01); *Y10T 29/49224* (2015.01)

(58) Field of Classification Search
CPC .............. C25D 1/02; C25D 5/12; C25D 3/48; G01R 3/00; Y10T 29/49224; Y10T 29/49213
USPC ............ 29/874, 882, 885, 705; 439/169, 219; 148/518; 156/150; 216/13, 41; 427/116, 125, 531
See application file for complete search history.

(56) References Cited

U.S. PATENT DOCUMENTS

| 5,951,881 | A | * | 9/1999 | Rogers et al. .................... 216/41 |
| 6,791,345 | B2 | * | 9/2004 | Maruyama et al. ...... 324/754.08 |
| 2008/0017246 | A1 | * | 1/2008 | Tabata et al. ...................... 137/3 |

FOREIGN PATENT DOCUMENTS

| JP | 2004-115838 A | 4/2004 |
| JP | 2008-025833 A | 2/2008 |
| JP | 2009-160722 A | 7/2009 |

OTHER PUBLICATIONS

International Search Report (PCT/ISA/210) issued on Jul. 5, 2011, by the Japanese Patent Office as the International Searching Authority for International Application No. PCT/JP2011/051560.

*Primary Examiner* — Peter DungBa Vo
*Assistant Examiner* — Jeffrey T Carley
(74) *Attorney, Agent, or Firm* — Buchanan Ingersoll & Rooney PC

(57) ABSTRACT

Disclosed is a manufacturing method which enables manufacturing of an ultra-fine, thin contact for current inspection jigs. After a gold or gold alloy plating layer is formed, an Ni electroformed layer is formed by electroformation on the outer periphery of the formed plating layer. After a resistant layer is formed on the outer periphery of the Ni electroformed layer, a spiral groove is formed in the resistant layer by laser exposure, and etching is carried out using the resistant layer as a masking material. The Ni electroformed layer is removed from the part of the resistant layer where the spiral groove was formed, and then the resistant layer is removed and the plating layer is removed from the part of the spiral groove section where the Ni electroformed layer was removed. The core material is then removed, leaving the plating layer inside the periphery of the Ni electroformed layer.

1 Claim, 7 Drawing Sheets

MANUFACTURING METHOD FOR CONTACT FOR CURRENT INSPECTION JIG, CONTACT FOR CURRENT INSPECTION JIG MANUFACTURED USING SAID METHOD, AND CURRENT INSPECTION JIG PROVIDED WITH SAID CONTACT

TECHNICAL FIELD

The present invention relates to a current inspection jig which is used in a current inspection apparatus, and in particular, to a contact for a current inspection jig which is disposed in the current inspection jig and comes into elastic contact with a current inspection sample.

BACKGROUND ART

The current inspection has been carried out in various technical fields. Examples of the subjects for the current inspection include an electronic device substrate and a circuit wiring substrate such as a semiconductor integrated circuit and a flat panel display (FPD). These elements are minimized in size, densified in arrangement, and advanced in performance, and a contact for the current inspection jig such as a contact probe coming into elastic contact with a sample which is disposed on a current inspection jig used in the current inspection is also required to be ultrafine and miniaturized.

The inventors of the present application propose a Ni electroformed pipe as the contact for the current inspection jig which is partially provided with a spring structure to cope with the ultrafine, miniaturized structure (Patent Literature 1).

The Ni electroformed pipe partially provided with the spring structure of Patent Literature 1 is manufactured to be ultrafine and thin such that the external diameter is 32 µm to 500 µm and the internal diameter is 30 µm to 450 µm, so that a high elastic property can be exhibited. The Ni electroformed pipe is manufactured by applying a manufacturing method (Patent Literature 2) proposed by the inventors of the application.

In addition, regarding the ultrafine spring structure, there is proposed a manufacturing method in which, after the resist layer is formed on the outer periphery of a hollow ultrafine pipe and the resist layer is irradiated with exposure beams to make a spiral groove of a uniform slit width thereon, the etching is performed by using the resist layer as a masking material and the ultrafine pipe wall on the formed groove portion is removed (Patent Literature 3).

CITATION LIST

Patent Literature

Patent Literature 1: Japanese Patent Application Laid-Open (JP-A) No. 2008-25833
Patent Literature 2: Japanese Patent Application Laid-Open (JP-A) No. 2004-115838
Patent Literature 3: Japanese Patent Application Laid-Open (JP-A) No. 2009-160772

SUMMARY OF INVENTION

Technical Problem

Since the Ni electroformed pipe partially provided with the spring structure proposed in Patent Literature 1 is manufactured ultrafine and thin, and can exhibit a high elastic property, there is a strong possibility that the current inspection is widely used in various technical fields in which samples are minimized in size, densified in arrangement, and advanced in performance.

Even though the samples for the current inspection are minimized in size, densified in arrangement, and advanced in performance, a contact for a current inspection jig which is made of the Ni electroformed pipe partially provided with the spring structure is also required to be manufactured with higher accuracy and precision.

An object of the invention is to propose a method of manufacturing a contact for a current inspection jig through which an ultrafine, thin contact for the current inspection jig provided with an electroformed spring structure can be manufactured with higher accuracy and precision; the contact for the current inspection jig manufactured through the method; and the current inspection jig which is provided with the contact.

Solution to Problem

According to an aspect of the present invention, a method of manufacturing a contact for a current inspection jig having an electroformed spring structure, the method includes: forming a gold or gold alloy plating layer on an outer periphery of a core material through plating and forming a Ni electroformed layer on an outer periphery of the formed plating layer through electroforming; forming a resist layer on an outer periphery of the Ni electroformed layer and exposing the resist layer under laser beams to form a spiral groove in the resist layer; performing etching by using the resist layer as a masking material to remove the Ni electroformed layer of a portion in which the spiral groove is formed in the resist layer; removing the resist layer and removing the plating layer of the spiral groove portion from which the Ni electroformed layer is removed; and removing the core material while the plating layer is left on an inner periphery of the Ni electroformed layer.

According to another aspect of the present invention, one end of a contact for the current inspection jig which is manufactured through the method as described above and is provided with an electroformed spring structure is formed as a contact end to a sample, and the other end is formed as a connection portion to the current inspection jig.

According to still another aspect of the present invention, a current inspection jig is provided with the contact for the current inspection jig as described above.

Advantageous Effects of Invention

According to the invention, an ultrafine, thin contact for a current inspection jig which is provided with an electroformed spring structure, can be manufactured with higher accuracy and precision. Since the contact for the current inspection jig is provided with a gold or gold alloy plating layer therein, it can exhibit an excellent conductivity. Then, it is possible to provide a current inspection jig provided with the contact for the current inspection jig which is manufactured with high accuracy and precision as described above and exhibit the excellent conductivity.

BRIEF DESCRIPTION OF DRAWINGS

FIG. 1 is a diagram schematically illustrating an exemplary arrangement of a continuous treatment apparatus which performs processes of forming a plating layer on the outer periphery of a core material through plating and then of forming a Ni electroformed layer on the outer periphery of the formed plating layer through the electroforming, in which FIG. 1(a) is a plan view and FIG. 1(b) is a side view.

FIG. 3 is a diagram illustrating a manufacturing procedure according to the invention, in which FIG. 3(a) is a side view illustrating a state in which a spiral groove is formed in a resist layer and an enlarged cross-sectional view partially illustrating a stacked state of a core material, a gold plating layer, and a Ni electroformed layer at the portions taken along the lines X-X, Y-Y, and Z-Z; FIG. 3(b) is a side view illustrating a state in which the Ni electroformed layer is removed through etching from the portion where the spiral groove is formed in the resist layer and an enlarged cross-sectional view partially illustrating the stacked state of the core material, the plating layer, and the Ni electroformed layer at the portions taken along the lines X-X, Y-Y, and Z-Z; FIG. 3(c) is a side view illustrating a state where the plating layer of the spiral groove portion from which the resist layer and the Ni electroformed layer are removed is removed and an enlarged cross-sectional view partially illustrating the stacked state of the core material, the plating layer, the Ni electroformed layer at the portions taken along the lines X-X, Y-Y, and Z-Z; and FIG. 3(d) is a side view illustrating a state where the core material is removed and an enlarged cross-sectional view partially illustrating the stacked state of the plating layer and the Ni electroformed layer at the portions taken along the lines X-X and Y-Y.

DESCRIPTION OF EMBODIMENTS

Figure 1:
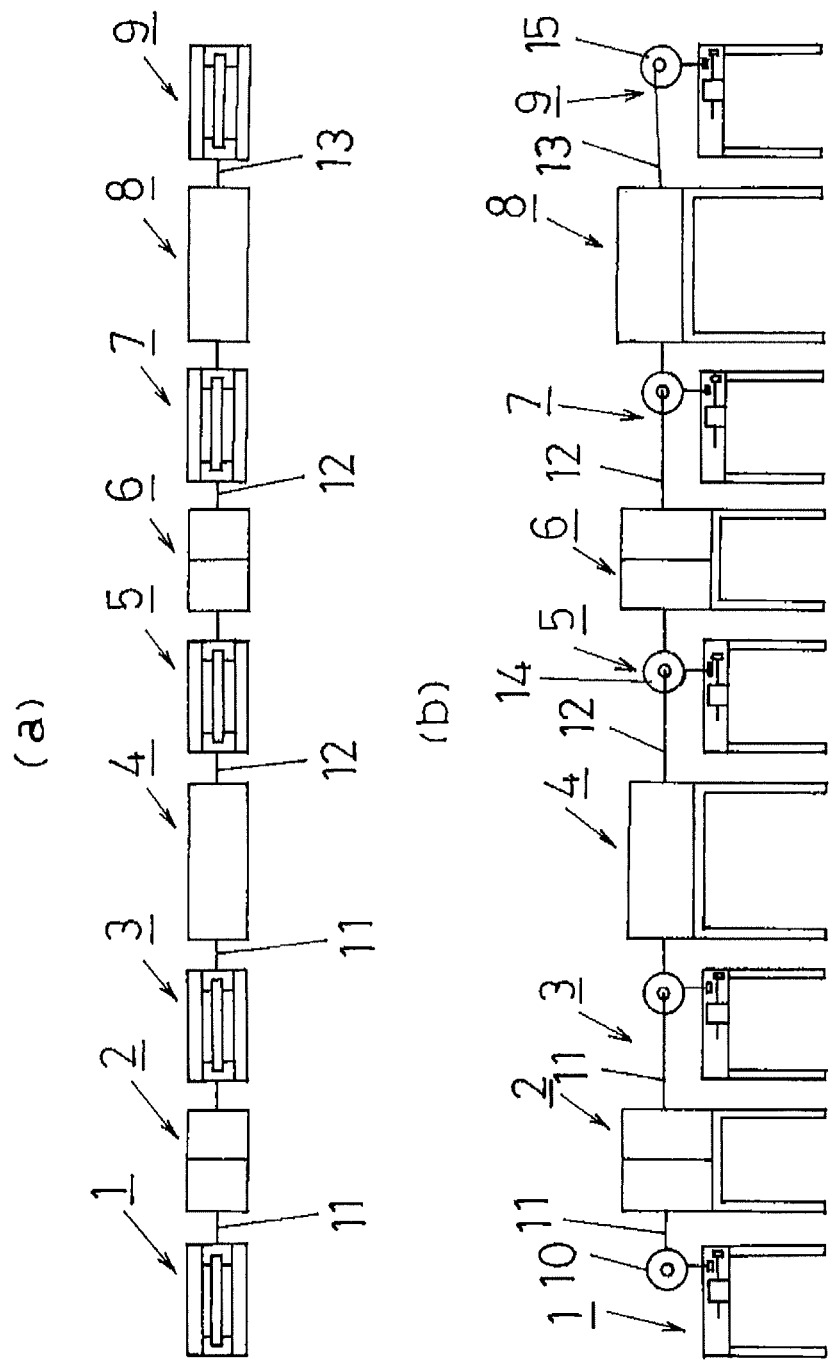

An ultrafine, thin contact for a current inspection jig which is provided with an electroformed spring structure according to the invention can be manufactured as described below.

After a gold or gold alloy plating layer is formed on the outer periphery of a core material through the plating, a Ni electroformed layer is formed on the outer periphery of the formed plating layer through the electroforming.

Examples of the core material may include an ultrafine metal wire and an ultrafine resin wire having an external diameter of 5 μm or more. Examples of the metal wire may include a stainless steel wire, an aluminum wire, and the like.

Examples of the resin wire may include a synthetic resin wire which is made of a nylon resin, a polyethylene resin, and the like.

Further, in a case where the resin wire is employed as the core material, there is a need to perform non-electrolytic plating for forming the gold or gold alloy plating layer. In consideration of the productivity, it is preferable that the metal wire be used as the core material and the gold or gold alloy plating layer be formed through electrolytic plating.

The gold or gold alloy plating layer is preferably formed to have a wall thickness of 0.2 μm to 1 μm, and the Ni electroformed layer formed on the outer periphery through the electroforming is preferably formed to have a wall thickness of 5 μm to 35 μm.

The contact for the current inspection jig which is manufactured by a manufacturing method according to the invention and the current inspection jig having the contact, for example, are used as a contact probe for substrate inspection having the probe, which is used for manufacturing an integrated circuit such as an LSI, and a current inspection jig provided with the contact. In other words, the contact and the current inspection jig are used for the current inspection of an electronic device substrate, a circuit wiring substrate, and the like which are minimized in size, densified in arrangement, and advanced in performance, and for the current inspection of other ultrafine, high-density samples. Herein, the manufactured contact for the current inspection jig is required to be ultrafine and thin in size such as the external diameter of about 20 μm to 500 μm, and the wall thickness of about 2.5 μm to 50 μm. The above-mentioned wall thicknesses of the gold or gold alloy plating layer and the Ni electroformed layer are determined in correspondence with the above-mentioned size of the manufactured contact for the current inspection jig. In addition, as to be described later, a predetermined portion of the Ni electroformed layer is dissolved and removed through the etching, and a predetermined portion of the plating layer is dissolved and removed through the subsequent processes, so that a spiral groove having a desired shape and size is formed with accuracy and precision. Therefore, the wall thicknesses are determined from the viewpoint of forming the spiral structure having an accurate and precise size of a slit width.

Next, the resist layer (a wall thickness of 2 μm to 50 μm) is formed on the outer periphery of the core material which includes the gold or gold alloy plating layer and the Ni electroformed layer formed on the outer periphery thereof.

The resist layer, for example, is formed such that the core material which includes the gold or gold alloy plating layer and the Ni electroformed layer formed on the outer periphery thereof is immersed into a photoresist chamber containing a photoresist solution for a predetermined time period.

In this way, after the formation of the resist layer on the outer periphery of the Ni electroformed layer, the resist layer is exposed under laser beams to form the spiral groove in the resist layer.

On performing the laser exposure, the core material having the resist layer formed thereon moves toward the upper side or the lower side in the vertical direction at a predetermined speed while the core material rotates around its center axis. On the other hand, the outer periphery of the core material corresponding to a predetermined range of the spiral structure to be formed in the longitudinal direction of the core material is irradiated with the laser beams.

Further, in a case where a positive photoresist is used, the portion exposed under the laser beams is dissolved by a developing solution to form the spiral groove in the resist layer. On the other hand, in a case where a negative photoresist is used, the portion exposed under the laser beams is not dissolved by the developing solution. Therefore, the portion unexposed under the laser beams is dissolved by the developing solution to form the spiral groove in the resist layer. The irradiation of the laser beams will be carried out by taking the situation into consideration.

With the formation of the spiral groove in the resist layer, the outer periphery of the Ni electroformed layer in the spiral groove portion formed in the resist layer is exposed.

Next, the etching is performed by using the resist layer remaining on the outer periphery of the Ni electroformed layer as a masking material, and the Ni electroformed layer is removed from the spiral groove portion formed in the resist layer.

For example, as described above, the core material in which the spiral groove is formed in the resist layer formed on the outer periphery of the Ni electroformed layer is immersed into an electropolishing acid solution so as to be electropolished. In this way, the etching is performed by using the resist layer remaining on the outer periphery of the Ni electroformed layer as the masking material, and the Ni electroformed layer is removed from the spiral groove portion formed in the resist layer.

Next, with the removal of the resist layer, the gold or gold alloy plating layer is removed from the spiral groove portion where the Ni electroformed layer has been removed.

For example, the removal of the plating layer is carried out by cleaning the core material, in which the Ni electroformed layer is removed from the spiral groove, in a predetermined solution with ultrasonic waves.

Finally, the core material is removed while the gold or gold alloy plating layer is left on the inside of the Ni electroformed layer.

In order to remove the core material while the gold or gold alloy plating layer is left on the inside of the Ni electroformed layer, there may employ a method in which the core material is stretched from one side or both sides thereof to make the cross-sectional area reduced, and a gap is formed between the outer periphery of the core material and the inner peripheral of the plating layer so as to pull out the core material. In addition, the core material may be removed by being immersed into a solution to chemically or electrochemically dissolve the core material.

In a case where the stainless steel wire or the resin wire is used as the core material, the core material is removed by the former pulling method. In a case where the aluminum wire is used as the core material, the latter chemical, electrochemical removal method may be employed. In this case, a strong alkaline solution such as sodium hydroxide and potassium hydroxide having little impact over an electrodeposit may be used as the solution.

According to the manufacturing method of the invention, although it may be affected by which one of the negative type and the positive type of resist material will be employed, basically, a width of the slit in the spiral structure portion can be set by the laser exposure. In addition to that the region for forming the spiral structure portion can be arbitrarily set in the ultrafine, thin Ni electroformed tube, the width of the slit in the spiral structure portion can be arbitrarily set, thereby providing the contact for the current inspection jig having an elastic property with high accuracy.

According to the manufacturing method of the invention, as described above, the etching is performed by using the resist layer remaining on the outer periphery of the Ni electroformed layer as the masking material, thereby removing the Ni electroformed layer from the spiral groove portion formed in the resist layer.

In this case, since the gold or gold alloy plating layer is present inside the Ni electroformed layer, an etching solution can be prevented from flowing into the Ni electroformed layer portion other than the formed spiral groove portion. Therefore, only the spiral groove portion formed in the Ni electroformed layer is immersed into the etching solution and is dissolved. As a result, a slit width in the spiral structure portion of the Ni electroformed tube which has been formed at the removal of the core material can be used just as the precise slit width formed through the laser exposure, and the slit width of the spiral structure portion can be set to be a uniform slit width as desired.

If the width of the slit in the spiral structure portion is set to be the uniform slit width as desired, the elastic property when one end of the manufactured contact for the current inspection jig is connected to the current inspection jig and the other end is pushed to be placed on the sample will be improved.

In addition, according to the manufacturing method of the invention, since the gold or gold alloy plating layer is present inside the Ni electroformed layer when the etching is performed, the etching solution is prevented from reaching the core material. If the etching solution is in contact with the core material, the core material is corroded, and in a case where a pulling method is employed to remove the core material, the core material may be broken in the middle of the pulling, so that it is difficult to remove the core material completely.

In the invention as described above, at the beginning, the gold or gold alloy plating layer is formed on the outer periphery of the core material through the plating, and then the Ni electroformed layer is formed on the outer periphery of the formed plating layer through the electroforming.

In this way, the significance in the formation of the gold or gold alloy plating layer inside the Ni electroformed layer will be exhibited in the subsequent process of "performing the etching by using the resist layer as the masking material, and removing the Ni electroformed layer from the portion of the spiral groove formed in the resist layer".

In other words, as described above, since the gold or gold alloy plating layer is present inside the Ni electroformed layer, it can be prevented that the etching solution flows back into the Ni electroformed layer portion other than the formed spiral groove portion. Then, the slit width of the spiral structure portion can be set to be the uniform slit width as desired.

In the invention, on etching, the Ni electroformed layer portion (the Ni electroformed layer portion other than the portion of the spiral groove formed in the resist layer) which will remain as the spring structure portion is masked with the resist layer on the outside thereof and with the gold or gold alloy plating layer on the inside thereof, respectively. In the case, the spring structure portion can be formed to have a thickness which has been designed as its dimension through the etching.

Particularly, since the Ni electroformed layer is configured to be formed on the outer periphery of the gold or gold alloy plating layer formed on the inside through the electroforming, there is no concern about that the etching solution is permeated to the contact face between the plating layer and the Ni electroformed layer (the etching solution flow back thereto) and thus the end portion facing the slit inside the Ni electroformed layer and the very inside are corroded by the etching solution.

Therefore, the slit width of the spiral structure portion can be set to be the uniform slit width as desired, and the wall thickness of the spiral structure portion can be precisely formed to have a dimension as it has been designed.

Forming the slit width of the spiral structure portion to be the uniform slit width as desired and forming the wall thickness to be the desired thickness (constant thickness) are significantly important in making the spring unit exhibit the desired elastic property, and in making the stable durability exhibited even when contraction motions are repeatedly performed plural times (hundreds of thousands of times to millions of times) like a probe.

According to the invention, in order to prevent, in advance, the etching solution from being permeated to the inside of the Ni electroformed layer (the etching solution flows back thereto) to corrode the end portion facing the slit inside the Ni electroformed layer and the very inside in the process of performing the etching with the use of the resist layer as the masking material to remove the Ni electroformed layer from the portion of the spiral groove formed in the resist layer, a layer member serving as the resist and masking material in an etching treatment process is formed on the outer periphery of the core material before the formation of the Ni electroformed layer on the outer periphery of the core material.

In this way, since the layer formed on the outer periphery of the core material before the formation of the Ni electroformed layer on the outer periphery of the core material has no choice but to be left on the inside of the Ni electroformed layer even after the formation of the spiral structure portion, the gold or gold alloy is employed to form the gold or gold alloy plating layer in consideration of the conductivity.

Example 1

An example of a method of manufacturing an ultrafine, thin contact 20 for a current inspection jig which is provided with an electroformed spring structure using an SUS wire having a diameter (5 μm to 450 μm) as a core material will be described.

Figure 2:
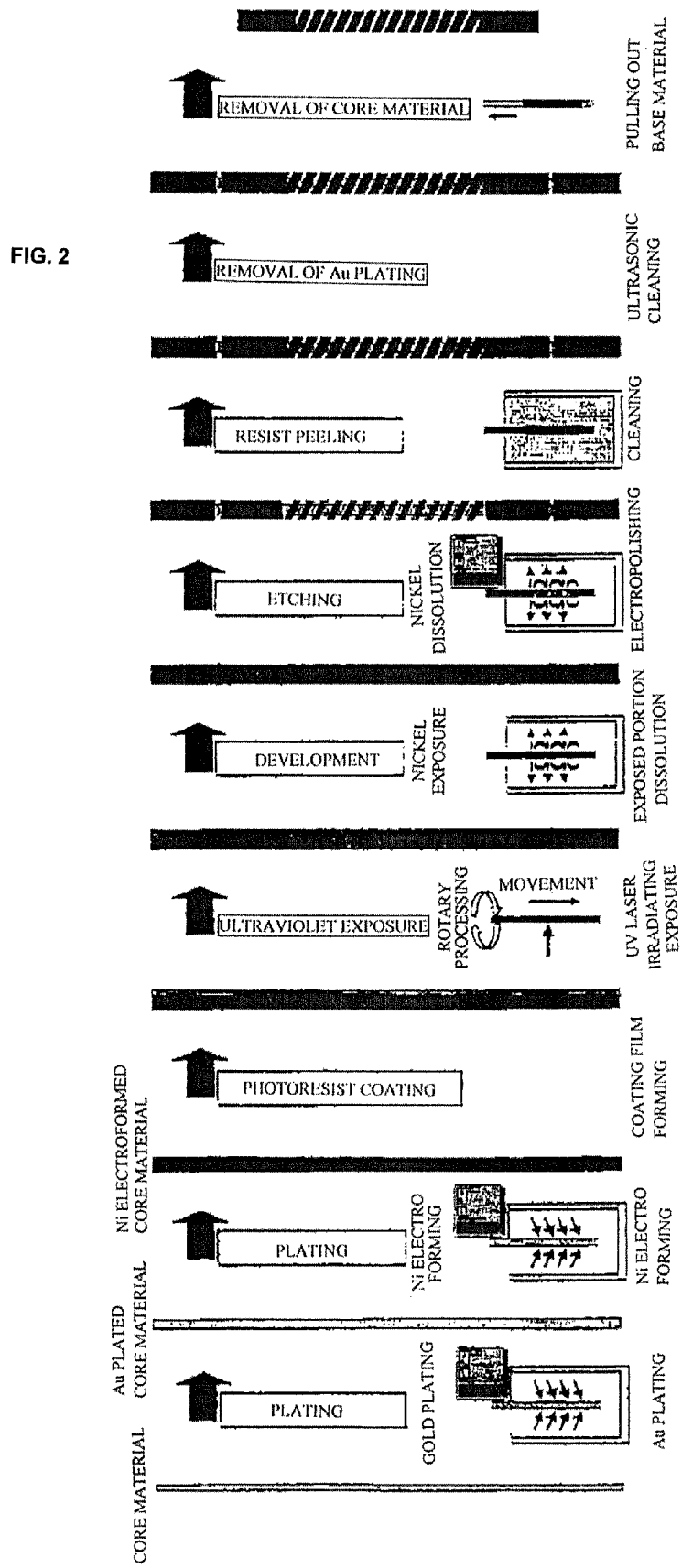
FIG. 2 is a block diagram schematically illustrating a manufacturing method according to the invention.

FIG. 1 is a diagram schematically illustrating an exemplary arrangement of a continuous treatment apparatus which performs processes of forming a gold plating layer 12 on the outer periphery of the core material through plating and then of forming a Ni electroformed layer 13 on the outer periphery of the formed gold plating layer 12 through the electroforming, and FIG. 2 is a block diagram schematically illustrating an example of a manufacturing method according to the invention.

A supply unit 1 is provided with a reel 10 around which the SUS wire 11 serving as the core material is wound.

The SUS wire 11 is reeled out from the reel 10 of the supply unit 1 by a transport roller 14 of a containing unit 5, and transferred to a gold plating unit 4 through a cleaning unit 2 and a current-supply and transport unit 3.

The cleaning unit 2 is charged with a predetermined weak alkaline solution or a weak acidic solution, in which the outer periphery of the SUS wire 11 is cleaned.

The gold plating unit 4 is filled with a predetermined electrolytic solution, for example, a non-cyanide Au solution, and through the plating, a predetermined wall thickness (0.2 μm to 1 μm) of the gold plating layer 12 is formed on the outer periphery of the SUS wire 11 which has been transferred into the gold plating unit 4.

Then, the SUS wire 11 of which the outer periphery is formed with the gold plating layer 12 by a transport roller 15 of the containing unit 9 provided with a cutting unit (not illustrated) is transferred to a nickel electroforming unit 8 through the cleaning unit 6 and a current-supply and transport unit 7.

The cleaning unit 6 contains the predetermined weak alkaline solution or the weak acidic solution, in which the outer periphery of the gold plating layer 12 is cleaned.

The nickel electroforming unit 8 contains the predetermined electrolytic solution, for example, a nickel sulfonic acid solution, and through the electroforming, a predetermined wall thickness (3 μm to 50 μm) of the Ni electroformed layer 13 is formed on the outer periphery of the gold plating layer 12 of the SUS wire 11 which has been transferred into the nickel electroforming unit 8.

The transport speeds of the transport rollers 14 and 15 of the containing units 5 and 9 are adjusted depending on how much wall thicknesses of the gold plating layer 12 and the Ni electroformed layer 13 will be formed on the outer periphery of the SUS wire 11.

Then, the SUS wire 11 in which the gold plating layer 12 and the Ni electroformed layer 13 are stacked on the outer periphery is cut by a desired length, for example, 30 mm by the cutting unit (not illustrated) which is provided in the containing unit 9.

Next, the SUS wire 11 in which the gold plating layer 12 and the Ni electroformed layer 13 are formed on the outer periphery is immersed into the photoresist chamber containing a positive photoresist solution for the predetermined time period, and a predetermined wall thickness (2 μm to 30 μm) of a resist layer 30 is formed on the outer periphery of the Ni electroformed layer 13.

Next, the SUS wire 11 moves toward the upper side in the vertical direction (an arrow 42) or toward the lower side in the vertical direction (an arrow 43) at a predetermined speed while the core material rotates in a direction of an arrow 40 or 41 around the center axis of the SUS wire 11 in which the resist layer 30 is formed. At the same time, the outer periphery of a spiral structure portion 14 (FIG. 3(d)) corresponding to a predetermined range of the spiral structure to be formed in the longitudinal direction of the SUS wire 11 is irradiated with the laser beams.

Figure 3:
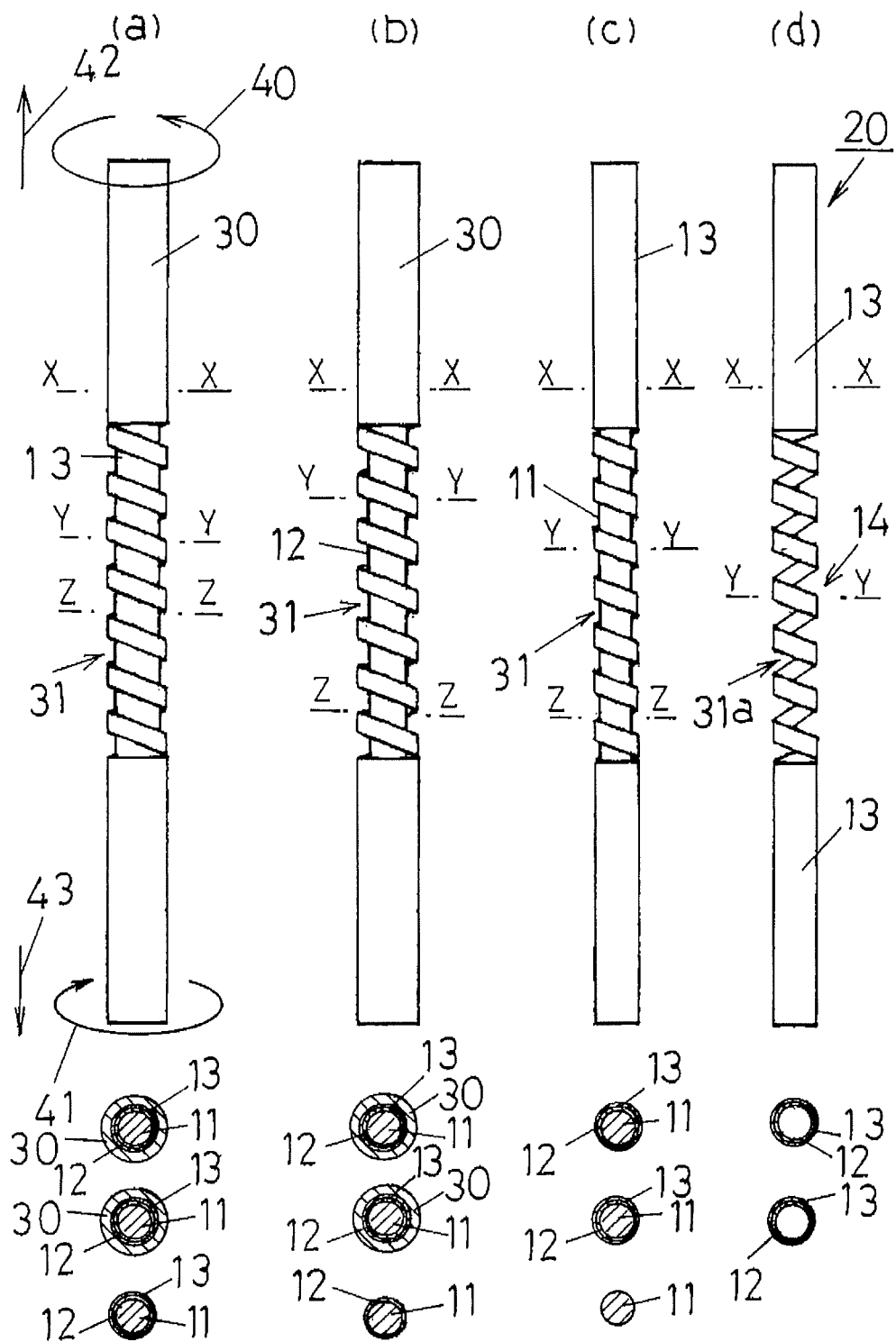

Thereafter, the resist layer 30 of the portion exposed with the laser beams is immersed into the developing solution to be dissolved, so that a spiral groove 31 is formed in the resist layer 30 (FIG. 3(a)). With the formation of the spiral groove 31 in the resist layer 30, the outer periphery of the Ni electroformed layer 13 is exposed from the portion where the spiral groove 31 is formed (FIG. 3(a)).

Next, the SUS wire 11 in which the spiral groove 31 is formed in the resist layer 30 which has been formed on the outer periphery of the Ni electroformed layer 13 is immersed into the electropolishing acid solution to be electropolished. Therefore, the etching is performed by using the resist layer 30 remaining on the outer periphery of the Ni electroformed layer 13 as the masking material, so that the Ni electroformed layer 13 is removed from the portion of the spiral groove 31 formed in the resist layer 30 (FIG. 3(b)). In this way, the outer periphery of the gold plating layer 12 is exposed from the portion where the spiral groove 31 is formed (FIG. 3(b)).

Next, with the removal of the resist layer 30, the SUS wire 11 is subjected to ultrasonic cleaning in pure water at a temperature (about 50 degrees) higher than a room temperature, so that the gold plating layer 12 is removed from the portion in which the Ni electroformed layer 13 corresponds to the removed spiral groove 31 (FIG. 3(c)). In this way, the outer periphery of the SUS wire 11 is exposed from the portion where the spiral groove 31 is formed (FIG. 3(c)).

Figure 4:
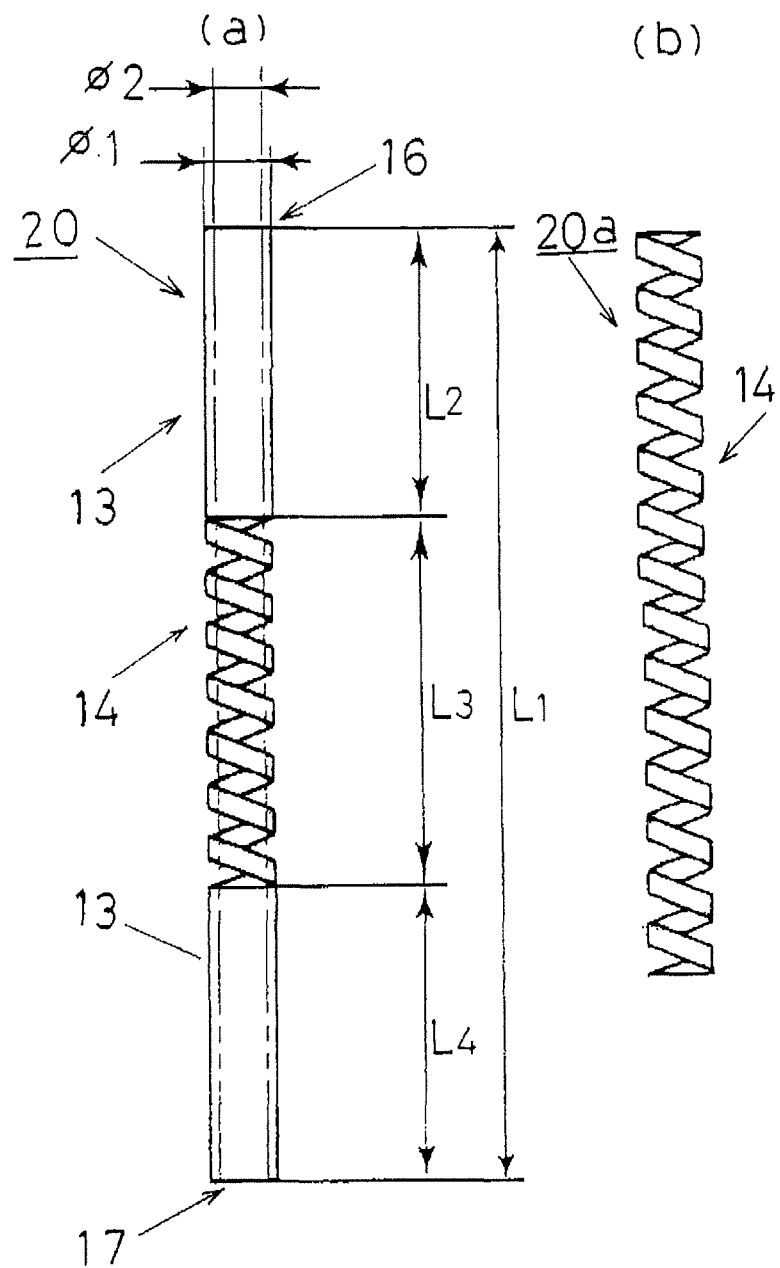
FIGS. 4(a) and 4(b) are side views illustrating an example of a contact for a current inspection jig which is manufactured according to the manufacturing method of the invention.

Finally, the SUS wire 11 is stretched from its one or both ends to make the cross-sectional area thereof small; a gap is formed between the outer periphery of the SUS wire 11 and the inner peripheral of the gold plating layer 12; and the SUS wire 11 is pulled out. Therefore, the SUS wire 11 is removed while the gold plating layer 12 is left on the inside of the Ni electroformed layer 13, thereby forming the ultrafine, thin contact 20 for the current inspection jig which is provided with the Ni electroformed spring structure (FIG. 3(d), FIG. 4(a), and FIG. 5).

Figure 5:
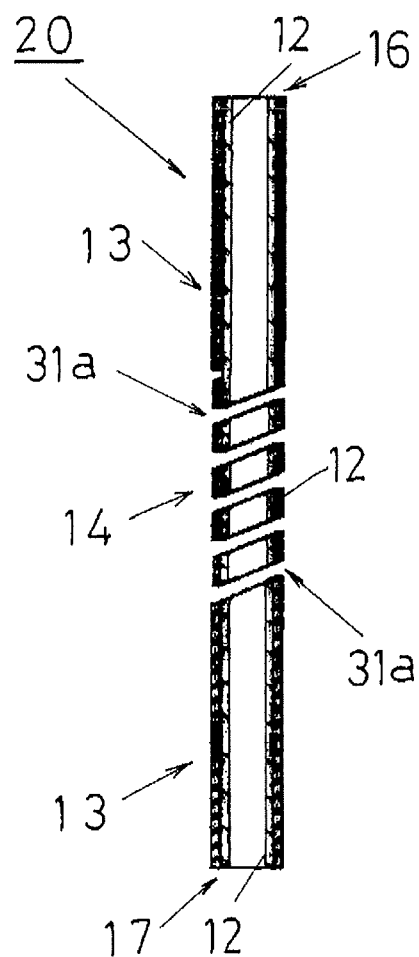
FIG. 5 is a cross-sectional view of the contact for the current inspection jig illustrated in FIG. 4(a).

The contact 20 for the current inspection jig manufactured as described above is a thin Ni electroformed tube which is provided with the gold plating layer 12 on the inside thereof and partially includes the spiral structure portion 14 as illustrated in FIG. 3(d), FIG. 4(a), and FIG. 5. The thin Ni electroformed tube which is provided with the gold plating layer 12 on the inside thereof is formed such that the SUS wire 11 is removed from the gold plating layer 12 and the Ni electroformed layer 13, which have been formed on the outer periphery of the SUS wire 11 serving as the core material, while the gold plating layer 12 is left on the inside of the Ni electroformed layer 13.

Then, the portion corresponding to the spiral groove 31 in the Ni electroformed layer 13 is dissolved through the etching to form a spiral slit 31a in the Ni electroformed layer 13, thereby forming the spiral structure portion 14.

FIG. 4(a) is a side view illustrating an example of the ultrafine, thin contact 20 for the current inspection jig which is manufactured according to the manufacturing method of the invention and provided with the electroformed spring structure, in which the spring structure portion denoted by the reference numeral 14 is formed partially.

Figure 6:
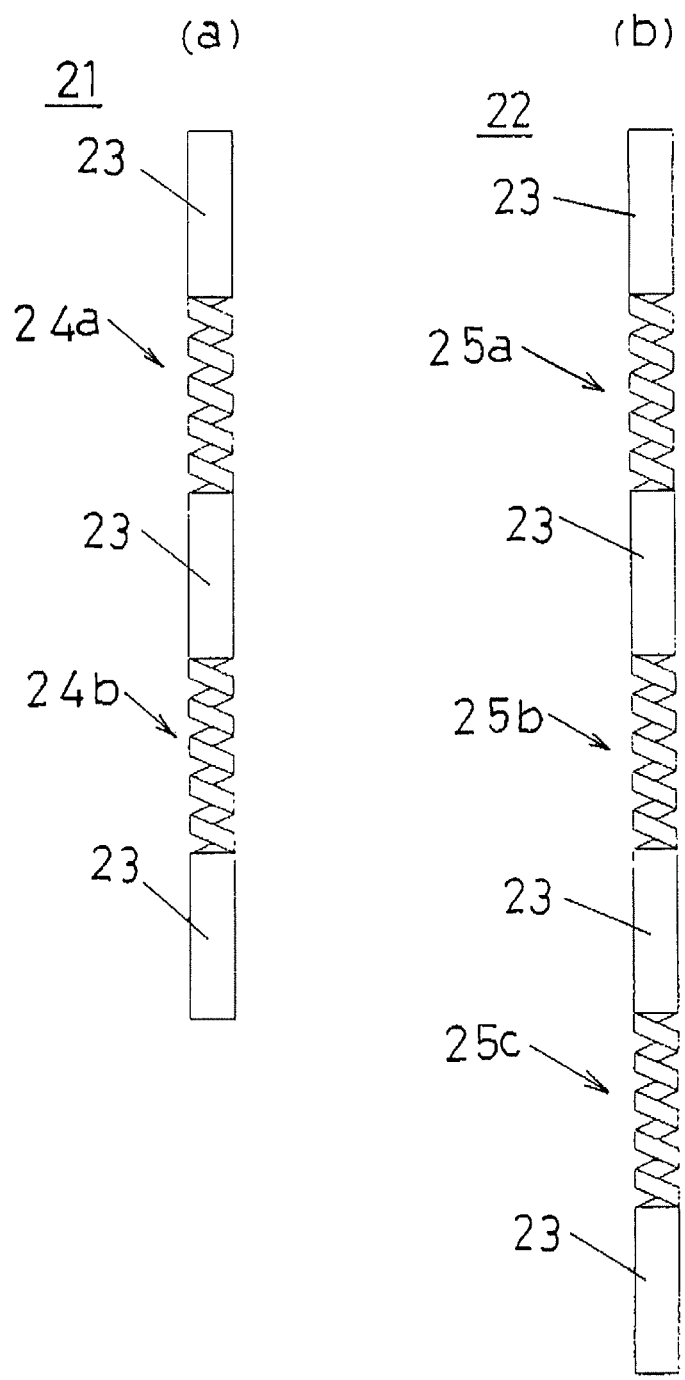
FIGS. 6(a) and 6(b) are side views illustrating another example of the contact for the current inspection jig which is manufactured according to the manufacturing method of the invention.

In addition, as illustrated in FIG. 6, the contact may be manufactured just like contacts 21 and 22 for the current inspection jig which includes tubular shaped portions 23 made of the Ni electroformed layer provided with the gold plating layer on the inside thereof and a plurality of spring structure portions 24a, 24b, 25a, 25b, and 25c.

The contact 20 for the current inspection jig according to the invention has been manufactured using the SUS wire 11 of the 21 µm external diameter through the above-described processes, in which the entire length L1 is 1 mm, the lengths L2 and L4 of the tubular shaped portions made of the Ni electroformed layer 13 which is provided with the gold plating layer 12 on the inside thereof are 0.1 mm, the length L3 of the spring structure portion 14 is 0.8 mm, the external diameter φ1 is 35 µm, and the internal diameter φ2 is 21 µm.

Further, the above numerical values L1, L2, L3, L4, φ1, and φ2 may be set to numeral values in accordance with design conditions.

In a case where a short length L1 of the contact 20 is manufactured, after a tube body made of the Ni electroformed layer 13 in which the gold plating layer 12 is formed on the inside thereof is cut at every 1 mm, the SUS wire 11 is removed, so that a plurality of the contacts 20 can be manufactured at the same times.

In other words, as described above, in a case where the SUS wire 11 having the entire length of 30 mm is used as the core material, the spring structure portion 14 is formed through the laser exposure such that the portion in the range of 0.1 mm from the one end is formed in a tubular shape, the portion in the subsequent range of 0.8 mm is formed to be the spring structure portion, the portion in the subsequent range of 0.2 mm is formed in the tubular shape, and the portion in the subsequent range of 0.8 mm is formed to be the spring structure portion. After being subjected to the process illustrated in FIG. 3(c) and before being removed, the SUS wire 11 is cut at every 1 mm using the laser beam. Thereafter, when the SUS wire 11 is removed, 30 pieces of the contacts 20 can be manufactured at the same time. As described above, in a case where the SUS wire 11 is stretched from one or both ends to be removed, there is a need to take holding portions into consideration which are necessary to be formed at the end portions. Even in this case, 25 to 26 pieces of the contacts 20 each having the entire length of 1 mm can be manufactured at the same time.

In addition, an ultrafine, thin contact 20a for the current inspection jig which is provided with the Ni electroformed spring structure illustrated in FIG. 4(b) may be manufactured. In this case, the SUS wire 11 having the entire length of 30 mm is subjected to the laser exposure to form the spring structure portion 14 over the entire length; before the removal, the SUS wire 11 is cut to have a desired length using the laser beam; and then the SUS wire 11 is removed. Therefore, a plurality of the contacts 20a can be manufactured at the same time.

The contact for the current inspection jig may be provided with the spring structure formed over parts or the entire length just like those illustrated in FIG. 3(d), FIG. 4(a), and FIG. 5, or that illustrated in FIG. 4(b).

In either case, according to the manufacturing method of the invention, the etching is performed by using the resist layer 30 as a mask in which the spiral groove 31 is formed through the laser exposure to dissolve and remove the predetermined portion of the Ni electroformed layer 13, and then to remove the portion of the gold plating layer 12 corresponding to the spiral groove 31 from which the Ni electroformed layer 13 is removed, so that the spring structure portion 14 is formed. Therefore, the spiral groove 31 having a desired shape and size is accurately and precisely formed, and thus the spiral structure which includes the spiral slit 31a having the accurate, precise size of the slit width can be formed.

The ultrafine, thin contacts 20 and 20a (FIG. 4) for the current inspection jig which is provided with the electroformed spring structure manufactured according to the manufacturing scheme of the invention can exhibit the excellent elastic property. This property is one of the properties, as described above, which can be exhibited from the structure in which the width of the slit 31a in the spiral structure portion is set to be the uniform slit width as desired.

The contact for the current inspection jig according to the above-described invention has been manufactured such that the wall thickness of the Ni electroformed layer 13 provided with the gold plating layer therein is 10 µm; the external diameter φ1 is 80 µm; the length L3 of the spring structure portion 14 is 2 mm; and the number of windings is 25, in which a spring load has been 2 gf/0.2 mm. In addition, the contact for the current inspection jig according to the above-described invention has been manufactured such that the wall thickness of the Ni electroformed layer 13 provided with the gold plating layer therein is 10 µm; the external diameter φ1 is 50 µm; the length L3 of the spring structure portion 14 is 2 mm; and the number of windings is 40, in which the spring load has been 4 gf/0.2 mm.

The ultrafine, thin contacts 20 and 20a (FIG. 4) for the current inspection jig provided with the electroformed spring structure which has been manufactured according to the manufacturing scheme of the invention use their one ends as contact ends to the sample and the other ends as connection portions to the current inspection jig.

In this case, in FIG. 4(a), the one end denoted by the reference numeral 17 can be used as the contact end to the sample, the other end denoted by the reference numeral 16 can be used as the connection portion to the current inspection jig.

Figure 7:
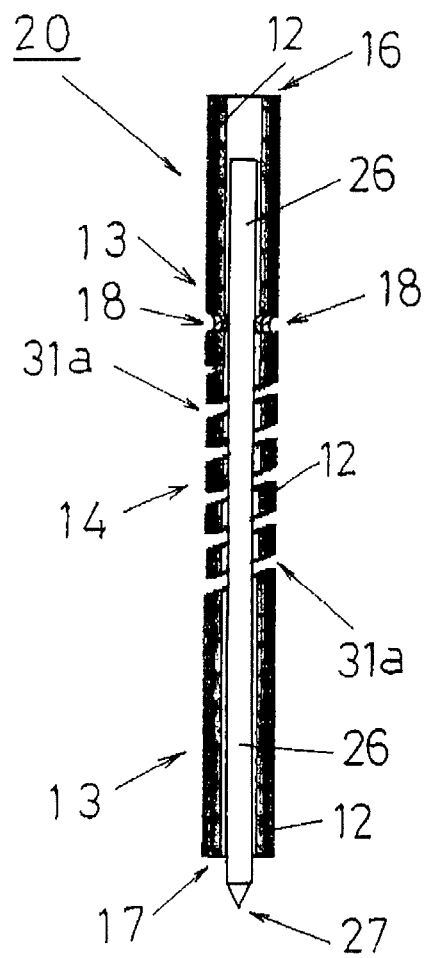
FIG. 7 is a cross-sectional view illustrating another example of the contact for the current inspection jig which is manufactured according to the manufacturing method of the invention.

In addition, as illustrated in FIG. 7, a conductive pin 26 is inserted to the inside, and a tip end 27 of the pin 26 abutted on a tip end 17 of the contact 20 for the current inspection jig is used as the contact end to the sample, so that the one end of the contact 20 for the current inspection jig can be used as the contact end to the sample.

In a case of the form illustrated in FIG. 7, the pin 26 may be fixed to the portion denoted by the reference numeral 18 in the drawing through a medium such as a swage, welding, and an adhesive.

In addition, in a case of the form illustrated in FIG. 7, the conductive pin 26 inserted to the inside may be manufactured by an ultrafine wire made of a metal wire excellent in conductivity, for example, platinum, rhodium, or an alloy thereof, or an ultrafine tungsten or BeCu (beryllium copper) wire which is subjected to the Ni plating and then the Au plating.

Figure 8:
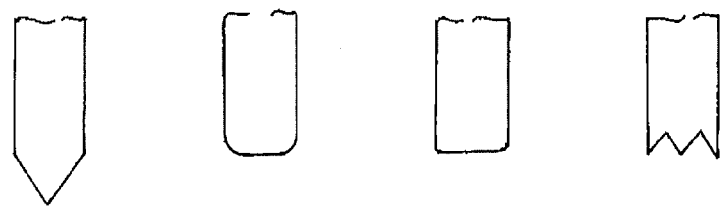
FIGS. 8(a), 8(b), 8(c), and 8(d) are side views partially illustrating tip end shapes on the sample contact side of the contact for the current inspection jig which is manufactured according to the manufacturing method of the invention.

In a case where the one end denoted by the reference numeral 17 of the contact 20 for the current inspection jig is used as the contact end to the sample, or in a case where the tip end 27 of the pin 26 abutting on the one end of the contact 20 for the current inspection jig is used as the contact end to the sample, the shape of the contact end may be various shapes such as a taper shape (FIG. 8(*a*)), a bent shape (FIG. 8(*b*)) with a radius R, a smooth flat shape (FIG. 8(*c*)), and a crown shape (FIG. 8(*d*)).

The contacts 20 and 20*a* (FIG. 4 and FIG. 7) for the current inspection jig may be used as a contact probe for inspecting substrates when the integrated circuit such as an LSI is manufactured. In addition, the current inspection jigs provided with the contacts 20 and 20*a* (FIG. 4 and FIG. 7) for the current inspection jig are used for the current inspection of other ultrafine, high-density samples as well as the current inspection of the electronic device substrate, the circuit wiring substrate, and the like.

Hitherto, the exemplary embodiments of the invention has been described with reference to the accompanying drawings, the invention is not limited to these embodiments, but various modifications can be made without departing from the technical scope which can be understood from the claims. For example, in the example, the gold plating layer 12 serving as the core material has been formed on the outer periphery of the SUS wire 11 through the plating, but the plating layer made of the gold alloy may be formed instead of the gold plating layer.

REFERENCE SIGNS LIST

11 SUS wire (core material)
12 gold plating layer
13 Ni electroformed layer
14 spiral structure portion
30 resist layer
31 spiral groove
31*a* spiral slit
20, 20*a*, 21, 22 contact for current inspection jig

The invention claimed is:

1. A method of manufacturing a contact for a current inspection jig having an electroformed spring structure, the method comprising:
    forming a gold or gold alloy plating layer on an outer periphery of a core material through plating and forming a nickel (Ni) electroformed layer on an outer periphery of the formed plating layer through electroforming;
    forming a resist layer on an outer periphery of the Ni electroformed layer and removing a portion of exposing the resist layer using a laser beam to form a spiral groove in the resist layer;
    performing etching by using the resist layer as a masking material to remove a portion of the Ni electroformed layer where the spiral groove is formed in the resist layer;
    removing a remainder of the resist layer and removing a portion of the plating layer where the spiral groove exists; and
    removing the core material while the plating layer is left on an inner periphery of the Ni electroformed layer.

* * * * *